(12) United States Patent
Xu et al.

(10) Patent No.: US 10,388,759 B2
(45) Date of Patent: Aug. 20, 2019

(54) METHOD FOR FABRICATING LIGHTLY DOPED DRAIN AREA, THIN FILM TRANSISTOR AND ARRAY SUBSTRATE

(71) Applicants: SHANGHAI TIANMA AM-OLED CO., LTD., Shanghai (CN); TIANMA MICRO-ELECTRONICS CO., LTD., Shanghai (CN)

(72) Inventors: Qiong Xu, Shanghai (CN); Jianjun Zhang, Shanghai (CN)

(73) Assignees: SHANGHAI TIANMA AM-OLED CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 51 days.

(21) Appl. No.: 15/654,502

(22) Filed: Jul. 19, 2017

(65) Prior Publication Data

US 2017/0317190 A1 Nov. 2, 2017

Related U.S. Application Data

(62) Division of application No. 14/815,526, filed on Jul. 31, 2015, now abandoned.

(30) Foreign Application Priority Data

Dec. 31, 2014 (CN) .......................... 2014 1 0851974

(51) Int. Cl.
*H01L 21/3213* (2006.01)
*H01L 29/66* (2006.01)
*H01L 29/786* (2006.01)

(52) U.S. Cl.
CPC .. *H01L 29/66757* (2013.01); *H01L 29/78621* (2013.01); *H01L 29/78675* (2013.01)

(58) Field of Classification Search
CPC ............. H01L 21/0337; H01L 21/4832; H01L 21/311; H01L 21/3213; H01L 29/401
See application file for complete search history.

(56) References Cited

U.S. PATENT DOCUMENTS 6,362,033 B1 3/2002 Lee et al.
2004/0229416 A1 11/2004 Shih
(Continued)

FOREIGN PATENT DOCUMENTS

DE 69215461 T2 4/1997
DE 69434235 T2 12/2005
JP 2001308337 A 11/2001

*Primary Examiner* — Jae Lee
(74) *Attorney, Agent, or Firm* — Alston & Bird LLP (57) ABSTRACT

Embodiments of the disclosure provide a method for fabricating a lightly doped drain area, a thin film transistor, and a thin film transistor array substrate. In an embodiment of the disclosure, a poly-silicon layer, a gate insulation layer, and a gate metal layer are formed in sequence on a substrate; the gate metal layer is patterned to form a gate electrode; the gate insulation layer is etched to form a stepped structure, wherein a width of the gate electrode is smaller than a width of the stepped structure, and an edge of the stepped structure is not covered by the gate electrode; and the poly-silicon layer is doped by an ion doping process using the gate electrode and the gate insulation layer with the stepped structure as a mask to form both a lightly doped area and a heavily doped area.

8 Claims, 9 Drawing Sheets

(56) References Cited

U.S. PATENT DOCUMENTS

2006/0267097 A1* 11/2006 Codama ............ H01L 29/66598
          257/347
2007/0096217 A1   5/2007 Lee et al.
2014/0295627 A1* 10/2014 Sun .................... H01L 27/1214
          438/157

* cited by examiner

METHOD FOR FABRICATING LIGHTLY DOPED DRAIN AREA, THIN FILM TRANSISTOR AND ARRAY SUBSTRATE

RELATED APPLICATIONS

This application is a divisional application of U.S. patent application Ser. No. 14/815,526 filed on Jul. 31, 2015, which claims priority of Chinese Patent Application No. 201410851974.0, filed Dec. 31, 2014, the content of which is hereby incorporated by reference in its entirety.

FIELD

The present disclosure relates to the field of liquid crystal displays and particularly to a method for fabricating a lightly doped drain area, a thin film transistor, and a thin film transistor array substrate.

BACKGROUND

Figure 1A:
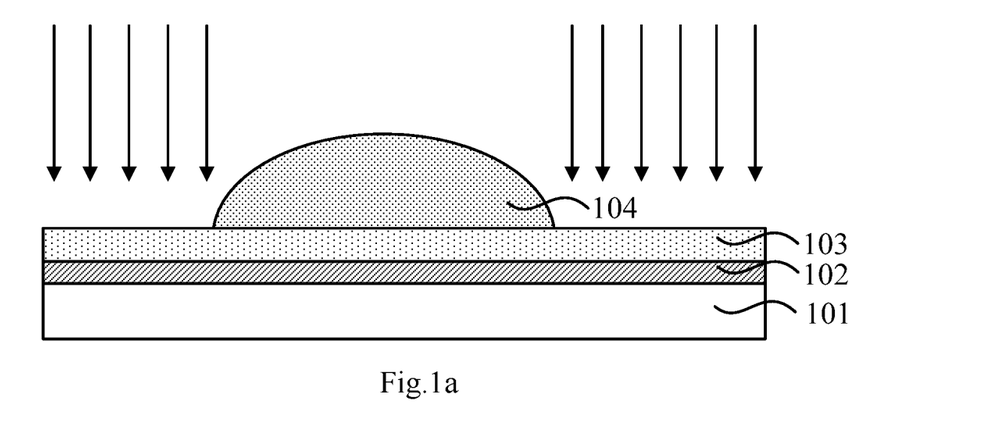
FIG. 1a and FIG. 1b illustrate schematic sectional views of a device in a method for forming an LDD area in the prior art.
Figure 1B:
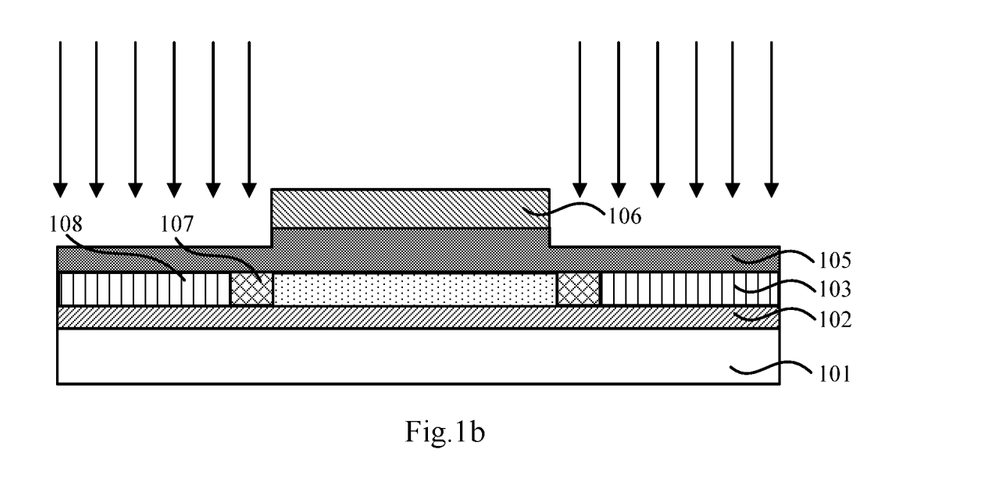

A demand for a panel with high resolution and low power consumption has been proposed constantly along with the development of a flat panel display. Low Temperature Poly-Silicon (LTPS) has been widely applied to a Liquid Crystal Display (LCD) and an Organic Light Emitting Diode (OLED) display due to its high mobility of electrons. In the LTPS technology, a Lightly Doped Drain (LDD) is commonly adopted to suppress leakage current rising abnormally. FIG. 1a and FIG. 1b illustrate schematic sectional views of a device in an existing method for forming an LDD area. As illustrated in FIG. 1a, after a buffer layer 102 and a poly-silicon layer 103 are formed in sequence on a substrate 101, a photo-resist layer 104 is applied on the poly-silicon layer 103 and patterned. An area of the poly-silicon layer 103, which is not covered by the photo-resist layer 104, is doped by an ion doping process, so that the area which is not covered by the photo-resist layer 104 can be subsequently doped for a second time into a heavily doped drain area. As illustrated in FIG. 1b, after the poly-silicon layer 103 is doped for the first time, a gate insulation layer and a gate metal layer are formed in sequence on the doped poly-silicon layer, and the gate metal layer is patterned to form a gate electrode 106. An injection area is defined using the gate electrode 106 as a mask through self-alignment of the gate electrode 106, and an area which is not covered by the gate electrode 106 is doped by an ion doping process, resulting in a lightly doped drain area 107 and a heavily doped drain area 108.

In summary, the LDD area has to be formed at present by two ion doping processes, thus complicating the preparation procedure, and it may not be easy to control the precision of a junction depth in the formed LDD area due to an error in alignment using the mask by two patterning processes.

SUMMARY

Embodiments of the disclosure disclose a method for fabricating a lightly doped drain area, a thin film transistor, and a thin film transistor array substrate.

An embodiment of the disclosure discloses a method for fabricating a lightly doped drain area, the method including:
forming a poly-silicon layer, a gate insulation layer, and a gate metal layer in sequence on a substrate;
patterning the gate metal layer to form a gate electrode;
etching the gate insulation layer to form a stepped structure, wherein a width of the gate electrode is smaller than a width of the stepped structure, and an edge of the stepped structure is not covered by the gate electrode; and
doping the poly-silicon layer by a doping process using the gate electrode, and the gate insulation layer with the stepped structure as a mask to form a lightly doped area and a heavily doped area.

An embodiment of the disclosure further discloses a Thin Film Transistor (TFT) including the lightly doped drain area fabricated by the fabricating method above, the TFT including:
a substrate, a poly-silicon layer, a gate insulation layer with a stepped structure, and a gate electrode formed in sequence on the substrate,
wherein a width of the gate electrode is smaller than a width of the stepped structure, and an edge of the stepped structure is not covered by the gate electrode; and
a width of the lightly doped area is equal to a width of an area of the stepped structure not covered by the gate electrode.

An embodiment of the disclosure further discloses a thin film transistor array substrate including the thin film transistor above.

DETAILED DESCRIPTION OF THE EMBODIMENTS

In order to make the objects, technical solutions and advantages of the disclosure more apparent, the disclosure will be described below in further details with reference to the drawings, and evidently the embodiments described here are merely a part but not all of the embodiments of the disclosure. All the other embodiments which can occur to those ordinarily skilled in the art based upon the embodiments here of the disclosure without any inventive effort shall fall into the scope of the disclosure as claimed.

Figure 2:
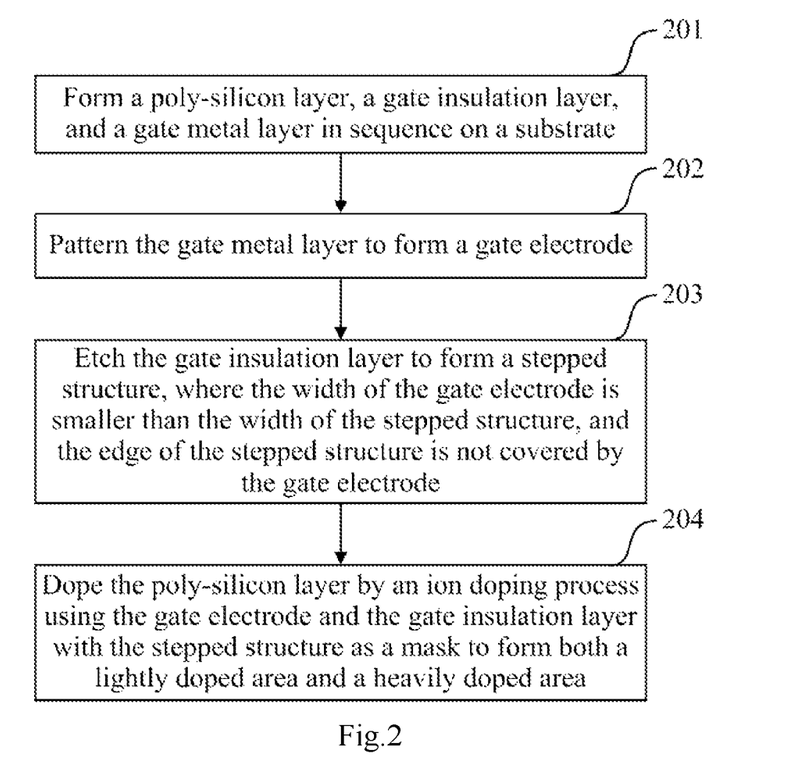
FIG. 2 illustrates a schematic flow chart of a method for fabricating an LDD area according to an embodiment of the disclosure.

FIG. 2 illustrates a schematic flow chart of a method for fabricating a lightly doped drain area according to an embodiment of the disclosure, where the method includes step 201 to step 204:

Step 201 is to form a poly-silicon layer, a gate insulation layer, and a gate metal layer in sequence on a substrate;

Step 202 is to pattern the gate metal layer to form a gate electrode;

Step 203 is to etch the gate insulation layer to form a stepped structure, where the width of the gate electrode is smaller than the width of the stepped structure, and the edge of the stepped structure is not covered by the gate electrode; and Step 204 is to dope the poly-silicon layer by an ion doping process using the gate electrode, and the gate insulation layer with the stepped structure as a mask to form both a lightly doped area and a heavily doped area.

Figure 3A:
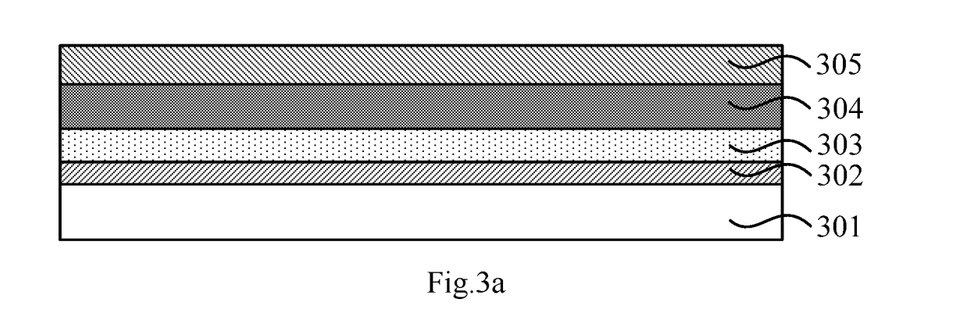
FIG. 3a to FIG. 3e illustrate a flow chart of a process of fabricating an LDD area according to an embodiment of the disclosure.

Particularly firstly the substrate 301 can be cleared by an initial clearing process as illustrated in FIG. 3a before step 201. In order to prevent an adverse influence of harmful substances in the substrate 301, e.g., alkali metal ions, on the performance of the poly-silicon layer 303, a buffer layer 302 can be deposited on the substrate 301 by a Plasma Enhanced Chemical Vapor Deposition (PECVD) process, and the substrate 301 needs to be pre-cleaned before the buffer layer 302 is deposited. The prepared buffer layer 302 can be annealed for a higher quality of the buffer layer 302.

In step 201, an amorphous silicon layer can be deposited on the buffer layer 302 by a PECVD process and dehydrogenated in an oven at high temperature to thereby prevent hydrogen explosion during crystallization and lower a defect density in the silicon layer after crystallization. The dehydrogenated amorphous silicon layer is poly-crystallized by a Low Temperature Poly-Silicon (LTPS) process. The amorphous silicon layer is crystallized typically by an Excimer Laser Annealing (ELA) process, a Metal Induced Crystallization (MIC) process, a Solid Phase Crystallization (SPC), etc., to form the poly-silicon layer 303. The surface of the poly-silicon layer 303 is treated so that the roughness on the surface of the poly-silicon layer 303 can be lowered and irregularities, protrusions, etc., arising from crystallization can be removed, thus the poly-silicon layer 303 can come into better contact with the subsequent thin film layer, thereby improving the performance of the entire device.

The gate insulation layer 304 in the embodiment of the disclosure includes a silicon nitride layer or a silicon oxide layer. The silicon nitride layer or the silicon oxide layer is formed on the poly-silicon layer 303 by a PECVD process to form the gate insulation layer 304.

Figure 3B:
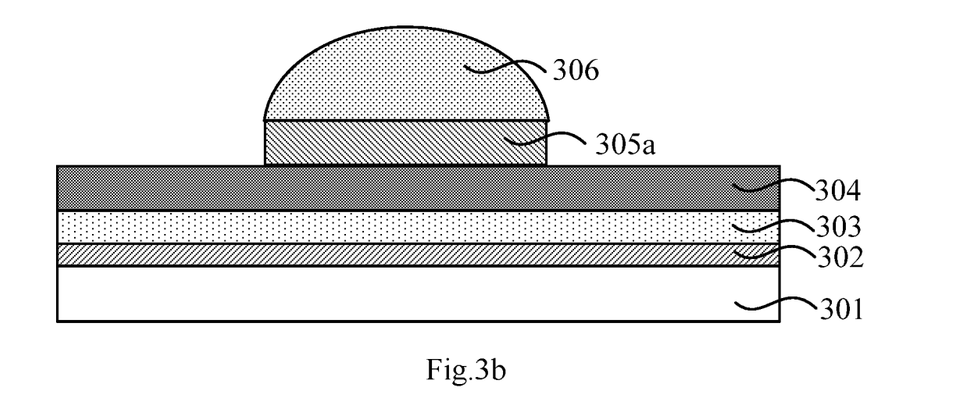

In step 202, as illustrated in FIG. 3b, photo-resist 306 is applied on the gate metal layer, exposed using a mask and developed into a preliminary gate electrode pattern; and the gate metal layer 305 is etched by a dry etching process to form a preliminary gate electrode 305a.

Figure 3C:
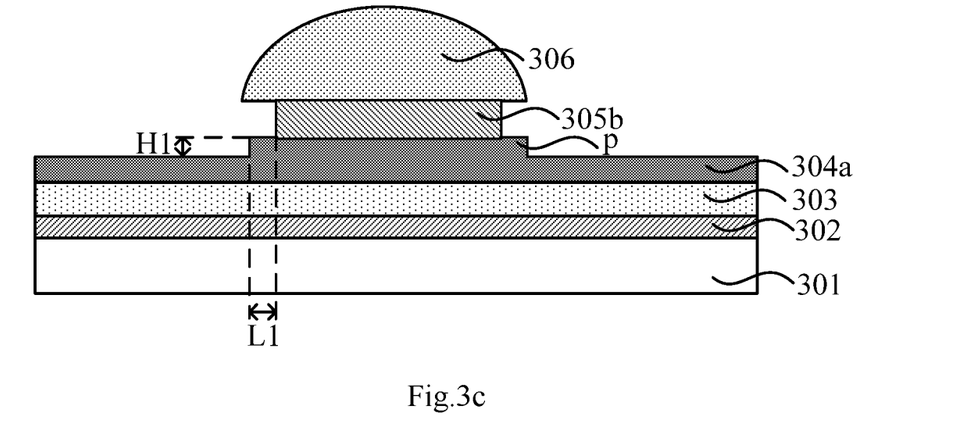

As illustrated in FIG. 3c, the preliminary gate electrode is etched by a wet etching process to form the gate electrode 305b while keeping the photo-resist 306 on the surface of the preliminary gate electrode, where the gate insulation layer 304 is not etched by the wet etching process while the preliminary gate electrode is etched.

In step 203, as illustrated in FIG. 3c, the surface of the gate insulation layer is etched by a dry etching process to form a gate insulation layer 304a with a stepped structure p after the gate electrode 305b is formed. Optionally the thickness of an area of the gate insulation layer 304a other than the stepped structure p is smaller than 800 angstroms. When the surface of the gate insulation layer is etched to form the stepped structure p, the etched area of the gate insulation layer is an area other than the area overlapped with the photo-resist 306, where the width of the gate electrode 305b is smaller than the width of the stepped structure p, and the edge of the stepped structure p is not covered by the gate electrode.

In the embodiment of the disclosure, as illustrated in FIG. 3c, the gate electrode 305b can be formed by controlling the etched amount, by which the preliminary gate electrode is pushed in, to thereby adjust the width $L_1$ of the area of the stepped structure p not covered by the gate electrode 305b.

Figure 3D:
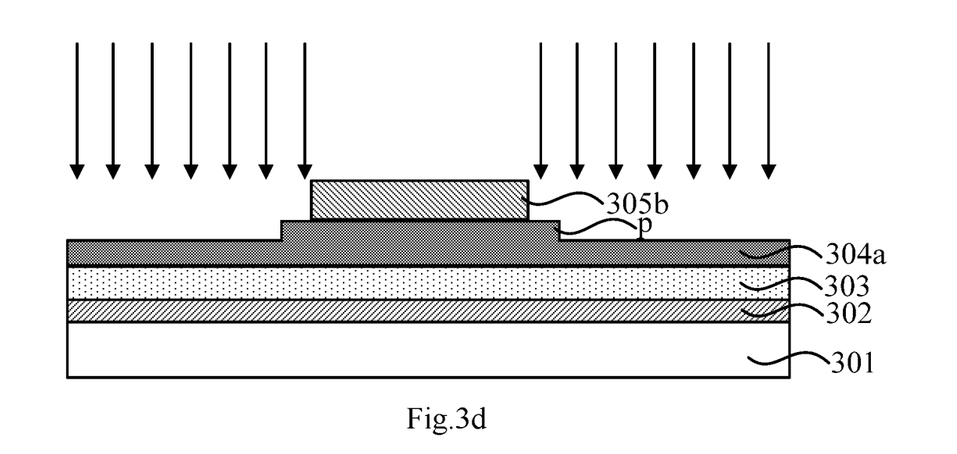
Figure 3E:
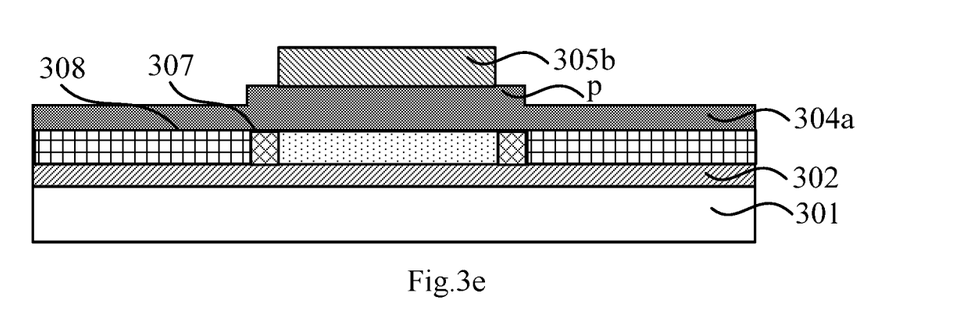

As illustrated in FIG. 3d, in step 204, the poly-silicon layer 303 is doped by an ion doping process using the gate electrode 305b, and the gate insulation layer 304a with the stepped structure as a mask. In the ion doping process, the area of the poly-silicon layer 303 covered by the gate electrode 305b will not be doped due to being shielded by the gate electrode 305b, whereas the area of the poly-silicon layer 303 not covered by the gate electrode 305b will be doped. Respective parts of the gate insulation layer 304a with the stepped structure p on the poly-silicon layer 303 vary in thickness, the thickness of the area of the stepped structure p is larger than the thickness of the area other than the stepped structure, and the gate insulation layer 304a varying in thickness applies varying shielding, so the doped concentration of the area of the poly-silicon layer corresponding to the gate insulation layer 304a at different thicknesses may be different. As illustrated in FIG. 3e, the lightly doped drain area 307 is formed in the area corresponding to the stepped structure p, and the heavily doped drain area 308 is formed in the area corresponding to the gate insulation layer other than the stepped structure, where the width of the lightly doped drain area 307 is equal to the width of the area of the stepped structure p not covered by the gate electrode 305b. Optionally firstly the remaining photo-resist can be removed before step 204.

In the embodiment of the disclosure, as illustrated in FIG. 3c, the width $L_1$ of the area of the stepped structure p not covered by the gate electrode 305b is adjusted so that the width of the formed lightly doped drain area 307 can be controlled flexibly. The stepped structure p can be formed by controlling the etched thickness to thereby adjust the thickness $H_1$ of the stepped structure and further strengthen or weaken shielding of the gate insulation layer against doping, so that the doped concentration of the formed lightly doped drain area 307 can be controlled flexibly.

Optionally the poly-silicon layer is an un-doped poly-silicon layer before the poly-silicon layer is doped and the LDD area is formed. Optionally the width of the area of the stepped structure not covered by the gate electrode is equal to an expected width of the lightly doped drain area.

In an embodiment of the disclosure, the poly-silicon layer, the gate insulation layer, and the gate metal layer are formed in sequence on the substrate; the gate metal layer is patterned to form the gate electrode; the gate insulation layer is etched to form the stepped structure, where the width of the gate electrode is smaller than the width of the stepped structure, and the edge of the stepped structure is not covered by the gate electrode; and the poly-silicon layer is doped by the ion doping process using the gate electrode and the gate insulation layer with the stepped structure as the mask to form both the lightly doped area and the heavily doped area. In the embodiment of the disclosure, since the width of the gate electrode is smaller than the width of the stepped structure, and the edge of the stepped structure is not covered by the gate electrode, the LDD area can be formed by only one ion doping process, and the height and the width of the stepped structure can be varied to thereby adjust flexibly the doped concentration and the size of the LDD area so as to alleviate leakage current effectively.

Figure 4:
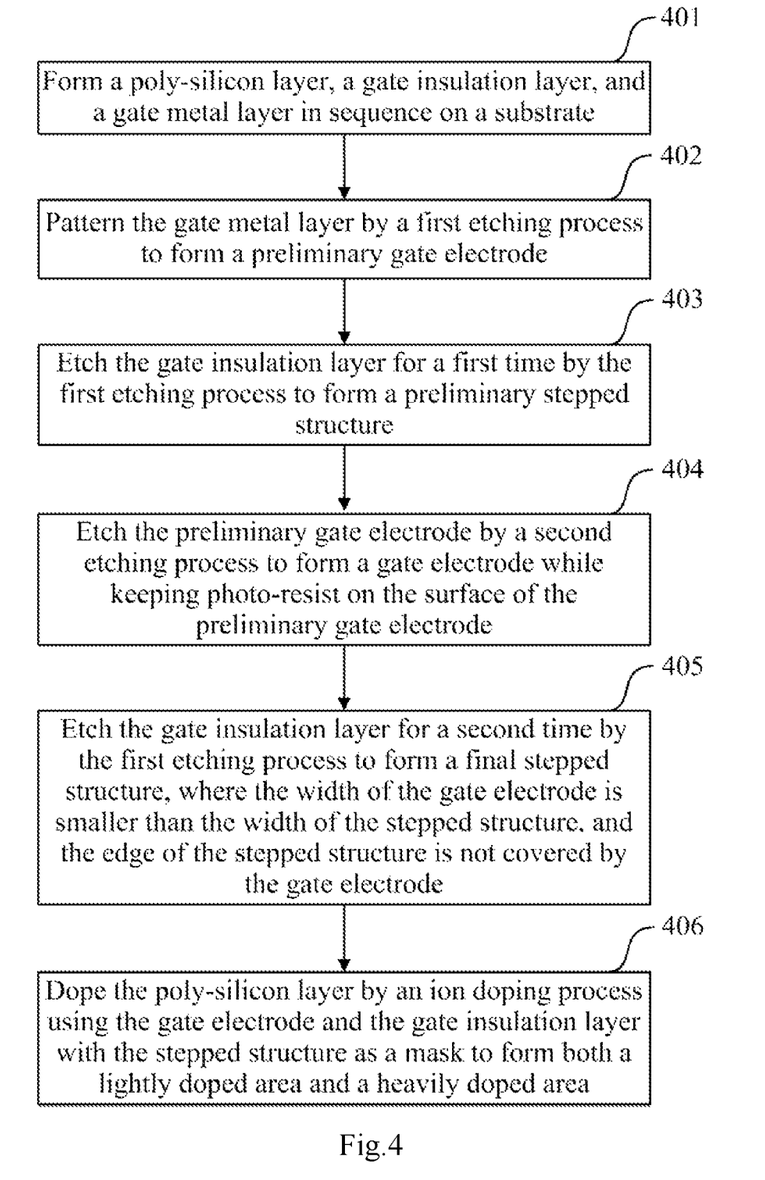
FIG. 4 illustrates a schematic flow chart of a method for fabricating an LDD area according to an embodiment of the disclosure.

Referring to FIG. 4, it illustrated a schematic flow chart of a method for fabricating a lightly doped drain area according to an embodiment of the disclosure, where the method includes step 401 to step 406; and also referring to FIG. 5a to FIG. 5e, they illustrated a flow chart of a process of preparing an LDD area according to an embodiment of the disclosure:

Step 401 is to form a poly-silicon layer 503, a gate insulation layer 504, and a gate metal layer 505 in sequence on a substrate 501;

Step 402 is to etch the gate metal layer 505 by a first etching process to form a preliminary gate electrode 505a;

Step 403 is to etch the gate insulation layer 504 for a first time by the first etching process to form a preliminary stepped structure p1;

Step 404 is to etch the preliminary gate electrode 505a by a second etching process to form a gate electrode 505b while keeping photo-resist 506 on the surface of the preliminary gate electrode 505a;

Step 405 is to etch the gate insulation layer 504 for a second time by the first etching process to form a final stepped structure p2, where the width of the gate electrode 505b is smaller than the width of the stepped structure p, and the edge of the stepped structure p2 is not covered by the gate electrode 505b;

Step 406 is to dope the poly-silicon layer 503 by an ion doping process using the gate electrode 505b and the gate insulation layer 504a with the stepped structure p2 as a mask to form both a lightly doped area 507 and a heavily doped area 508.

Figure 5A:
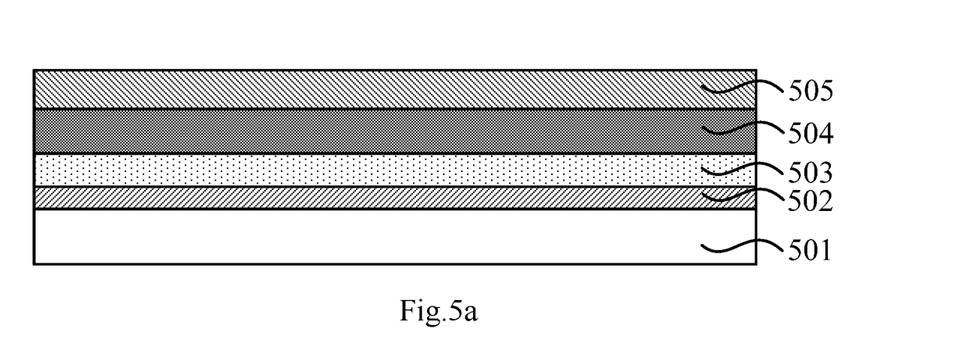
FIG. 5a to FIG. 5e illustrate a flow chart of a process of fabricating an LDD area according to an embodiment of the disclosure.

Particularly firstly the substrate 501 can be cleared by an initial clearing process as illustrated in FIG. 5a before step 401. In order to prevent an adverse influence of harmful substances in the substrate 501, e.g., alkali metal ions, on the performance of the poly-silicon layer 503, a buffer layer 502 can be deposited on the substrate 501 by a PECVD process, and the substrate 501 needs to be pre-cleaned before the buffer layer 502 is deposited. The prepared buffer layer 502 can be annealed for a higher quality of the buffer layer 502.

In step 401, an amorphous silicon layer can be deposited on the buffer layer 502 by a PECVD process and dehydrogenated in an oven at high temperature to thereby prevent hydrogen explosion during crystallization and low a defect density in the silicon layer after crystallization. The dehydrogenated amorphous silicon layer is poly-crystallized by a Low Temperature Poly-Silicon (LTPS) process. The amorphous silicon layer is crystallized typically by an Excimer Laser Annealing (ELA) process, a Metal Induced Crystallization (MIC) process, a Solid Phase Crystallization (SPC), etc., into the poly-silicon layer 503. The surface of the poly-silicon layer 503 is treated so that the roughness on the surface of the poly-silicon layer 503 can be lowered by removing irregularities, protrusions, etc., arising from crystallization so that the poly-silicon layer 503 can come into better contact with the subsequent thin film layer to thereby improve the performance of the entire device.

The gate insulation layer 504 in the embodiment of the disclosure includes a silicon nitride layer or a silicon oxide layer. The silicon nitride layer or the silicon oxide layer is formed on the poly-silicon layer 503 by a PECVD process resulting in the gate insulation layer 504.

Figure 5B:
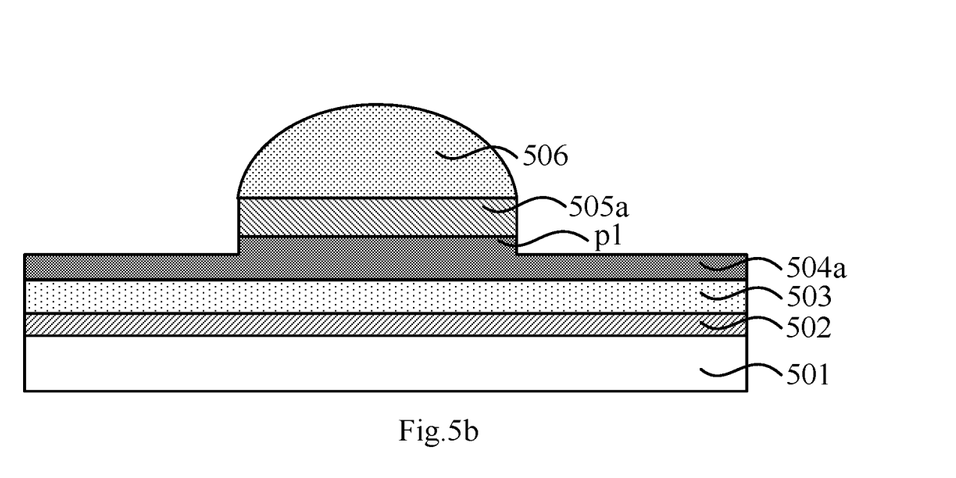

In step 402, as illustrated in FIG. 5b, photo-resist 506 is applied on the gate metal layer, exposed using a mask and developed into a preliminary gate electrode pattern; and the gate metal layer is etched by a dry etching process to form a preliminary gate electrode 505a.

In step 403, as illustrated in FIG. 5b, the gate insulation layer 504 is etched for a first time by a dry etching process to form the preliminary stepped structure p1.

Figure 5C:
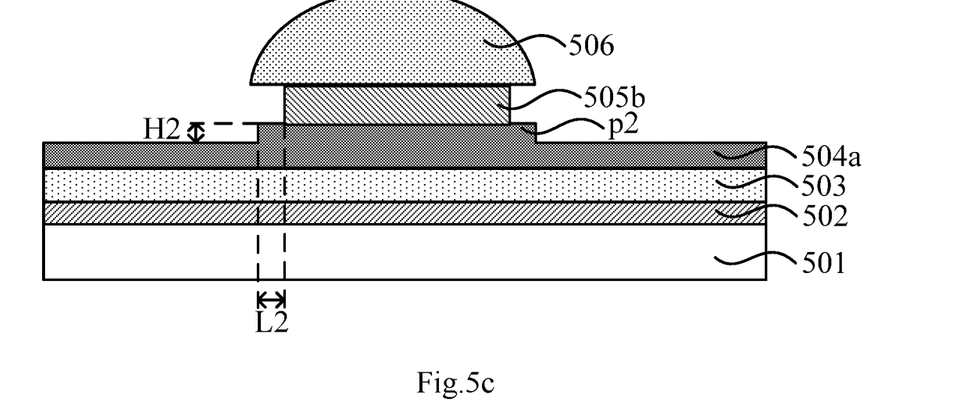

In step 404, as illustrated in FIG. 5c, the preliminary gate electrode is etched by a wet etching process to form a gate electrode 505b while keeping the photo-resist 506 on the surface of the preliminary gate electrode.

In step 405, as illustrated in FIG. 5c, the gate insulation layer is etched for a second time by a dry etching process to form the final stepped structure p2. Optionally the thickness of an area of the gate insulation layer 504a with the stepped structure p2 other than the stepped structure p2 is smaller than 800 angstroms. The preliminary stepped structure p1 can be etched for the second time to thereby further adjust the height of the stepped structure so as to control the doped concentration of the formed LDD area. Alternatively the second etching may not be performed if the thickness of the preliminary stepped structure p1 formed by the first etching process is as expected.

Where the width of the gate electrode 505b is smaller than the width of the stepped structure p2, and the edge of the stepped structure p2 is not covered by the gate electrode 505b. Optionally in the embodiment of the disclosure, the etching rate of the second etching is lower than the etching rate of the first etching. The first etching process can be performed at a higher etching rate to thereby improve the efficiency of etching effectively, and the preliminary stepped structure p1 can be further adjusted in the second etching performed at a lower etching rate for a better effect of adjusting.

Figure 5D:
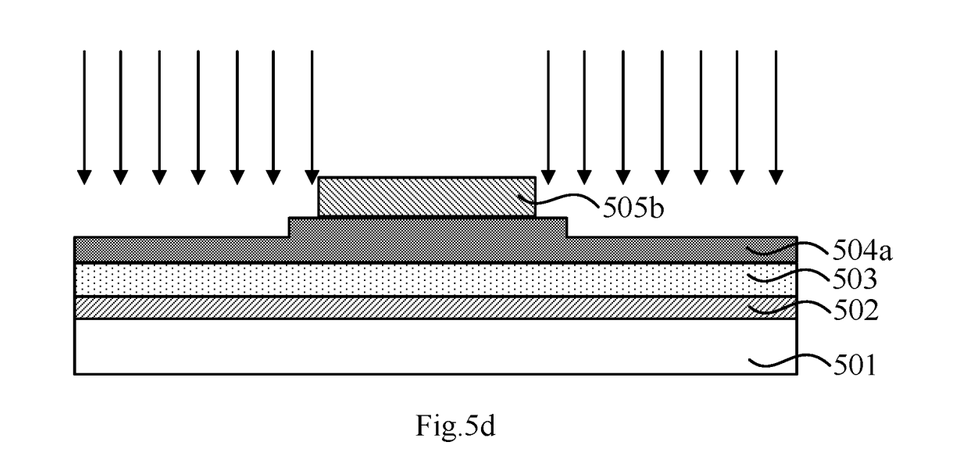
Figure 5E:
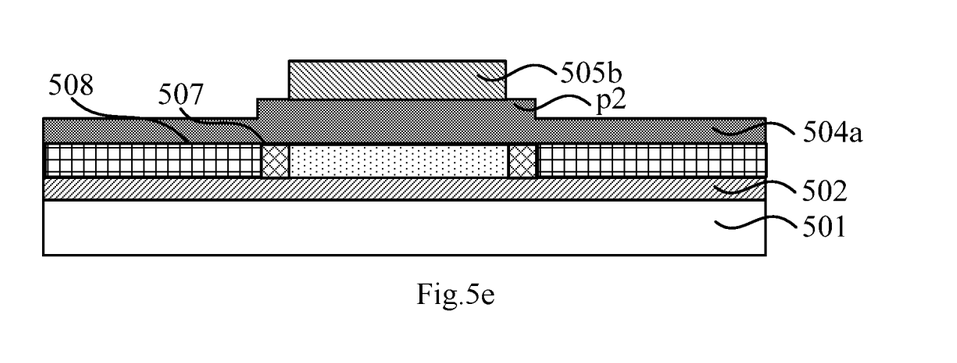

In step 406, as illustrated in FIG. 5d, the poly-silicon layer 503 is doped by an ion doping process using the gate electrode 505b and the gate insulation layer 504a with the stepped structure as a mask. In the doping process, the area of the poly-silicon layer 503 covered by the gate electrode will not be doped, whereas only the area of the poly-silicon layer 503 not covered by the gate electrode will be doped. The gate insulation layer with the stepped structure on the poly-silicon layer 503 varies in thickness, and the thickness of the area of the stepped structure is larger than the thickness of the area other than the stepped structure, so the poly-silicon layer 503 will be doped differently in concentration. As illustrated in FIG. 5e, the lightly doped drain area 507 is formed in the area corresponding to the stepped structure, and the heavily doped drain area 308 is formed in the area corresponding to the gate insulation layer other than the stepped structure, where the width of the lightly doped drain area 507 is equal to the width of the area of the stepped structure not covered by the gate electrode 505b. Optionally firstly the remaining photo-resist can be removed before step 406.

In the embodiment of the disclosure, as illustrated in FIG. 5c, the width $L_2$ of the area of the stepped structure not covered by the gate electrode 505b is adjusted so that the width of the formed lightly doped drain area 507 can be controlled flexibly. The stepped structure p2 can be formed by controlling the etched thickness to thereby adjust the thickness $H_2$ of the stepped structure p2, so that the doped concentration of the formed lightly doped drain area 507 can be controlled flexibly.

Optionally the poly-silicon layer 503 is an un-doped poly-silicon layer before the poly-silicon layer is doped and the LDD area is formed. Optionally the width of the area of the stepped structure not covered by the gate electrode is equal to the expected width of the lightly doped drain area.

Figure 6:
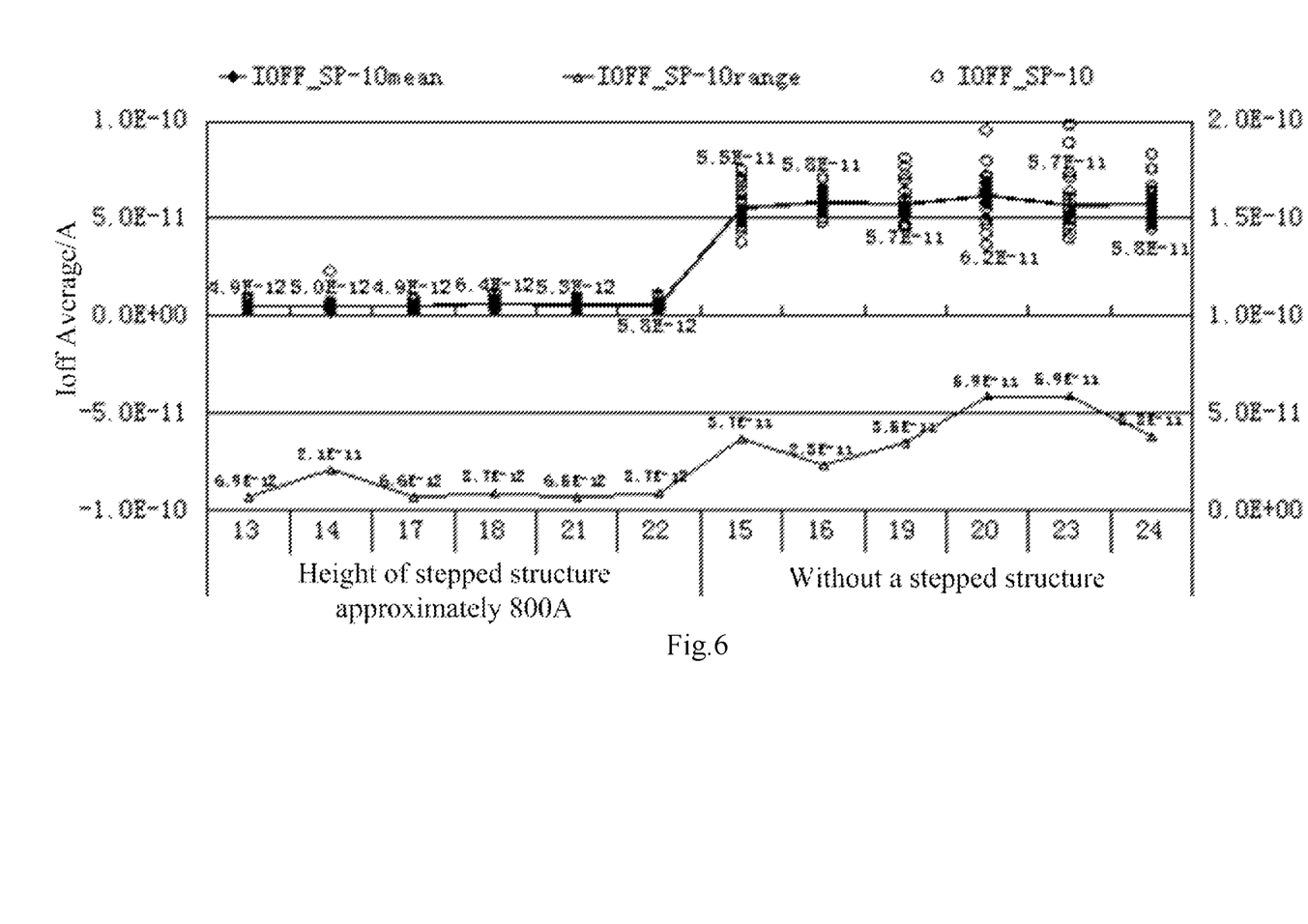
FIG. 6 illustrates a comparison diagram of current when a TFT is turned off, where the drain area of the TFT is formed through a gate insulation layer with a stepped structure or a gate insulation layer without a stepped structure.

The formation of the lightly doped drain area in an embodiment of the disclosure will be described below with respect to the result of a particular experiment. FIG. 6 illustrates a comparison diagram of current when a TFT is turned off, where the drain area of the TFT is formed through a gate insulation layer with a stepped structure or a gate insulation layer without a stepped structure.

In this experiment, the lightly doped drain area is formed by the method according to an embodiment of the disclosure, and further a TFT with the lightly doped drain area is fabricated. Also the drain area is fabricated by a similar process flow but without the stepped structure, and further a TFT without the lightly doped drain area is fabricated for the comparative experiment. Boron ions are doped at an energy of 20 Kev and a dosage of 8E14, the gate insulation layer is consisted of a silicon oxide layer and a silicon nitride layer, and the height of the stepped structure (i.e., the thickness of the stepped structure) is 800 angstroms including the 200 angstrom of the silicon oxide layer and the 600 angstrom of the silicon nitride layer. In the experiment, a plurality of TFTs and a plurality of stepped structures in the plurality of TFTs are formed, where the width of the plurality of stepped structures ranges from 0.65 to 1.34 μm and is averaged as 0.79 μm. For the single-gate PTFT formed in the experiment, FIG. 6 illustrates comparison of drain current when the TFT is turned off in the case of Vd=−10V.

The upper curve in the figure represents the average of the current in the OFF state, and as can be seen from the curve, the average of the leakage current when the TFT including the lightly doped drain area which is formed as a result of the stepped structure is turned off is significantly smaller than the average of the leakage current when the TFT including no lightly doped drain area is turned off. The lower curve in the figure represents the difference between the maximum and the minimum of the current in the OFF state, and as can be seen from the curve, the uniformity of the leakage current when the TFT including the lightly doped drain area which is formed as a result of the stepped structure is turned off is better than the uniformity of the leakage current when the TFT including no lightly doped drain area is turned off.

In an embodiment of the disclosure, the lightly doped drain area and the heavily doped drain area are formed in the steps above, and since the width of the gate electrode is smaller than the width of the stepped structure, and the edge of the stepped structure is not covered by the gate electrode, the LDD area can be formed by only one ion doping process, and the height and the width of the stepped structure can be varied to thereby adjust flexibly the doped concentration and the size of the LDD area so as to alleviate leakage current effectively.

An embodiment of the disclosure further provides a Thin Film Transistor (TFT) including the LDD area fabricated in the method according to the embodiments above of the disclosure, and further including:

A substrate, and a buffer layer, a poly-silicon layer, a gate insulation layer with a stepped structure, a gate electrode, a source, and a drain disposed in sequence on the substrate, where the width of the gate electrode is smaller than the width of the stepped structure, and the edge of the stepped structure is not covered by the gate electrode; and the LDD area is equal in width to an area of the stepped structure not covered by the gate electrode.

Figure 7:
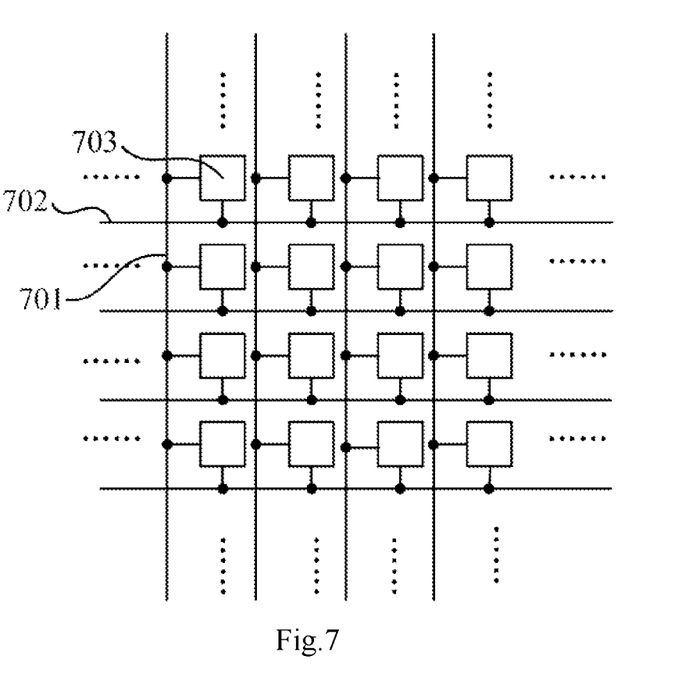
FIG. 7 illustrates a schematic diagram of a TFT array substrate according to an embodiment of the disclosure.

FIG. 7 illustrates a schematic diagram of a TFT array substrate according to an embodiment of the disclosure, where the TFT array substrate includes a plurality of the TFTs according to the embodiment above of the disclosure and further includes a plurality of data lines 701, a plurality of gate lines 702, and a pixel area 703 in which the TFTs are arranged.

As is apparent from the disclosure above, in the embodiments of the disclosure, the poly-silicon layer, the gate insulation layer, and the gate metal layer are formed in sequence on the substrate; the gate metal layer is patterned to form the gate electrode; the gate insulation layer is etched to form the stepped structure, where the width of the gate electrode is smaller than the width of the stepped structure, and the edge of the stepped structure is not covered by the gate electrode; and the poly-silicon layer is doped by the ion doping process using the gate electrode and the gate insulation layer with the stepped structure as the mask to form both the lightly doped area and the heavily doped area. In the embodiments of the disclosure, since the width of the gate electrode is smaller than the width of the stepped structure, and the edge of the stepped structure is not covered by the gate electrode, the LDD area can be formed by only one ion doping process, and the height and the width of the stepped structure can be varied to thereby adjust flexibly the doped concentration and the size of the LDD area so as to alleviate leakage current effectively.

Although the preferred embodiments of the disclosure have been described, those skilled in the art benefiting from the underlying inventive concept can make additional modifications and variations to these embodiments. Therefore the appended claims are intended to be construed as encompassing the optional embodiments and all the variations and modifications falling into the scope of the disclosure.

Evidently those skilled in the art can make various modifications and variations to the disclosure without departing from the spirit and scope of the disclosure. Thus the disclosure is also intended to encompass these modifications and variations thereto so long as the modifications and variations fall into the scope of the claims appended to the disclosure and their equivalents.

The invention claimed is:

1. A method for fabricating a lightly doped area, the method comprising:
    forming a poly-silicon layer, a gate insulation layer, and a gate metal layer in sequence on a substrate;
    applying photo-resist on the gate metal layer, exposing the photo-resist using a mask, and developing the photo-resist to form a preliminary gate electrode pattern;
    etching the gate metal layer by a first dry etching process to form a preliminary gate electrode;
    etching the preliminary gate electrode by a wet etching process to form a gate electrode while keeping the photo-resist on a surface of the preliminary gate electrode;
    etching the gate insulation layer by a second dry etching process to form a stepped structure, wherein a width of the gate electrode is smaller than a width of the stepped structure, and an edge of the stepped structure is not covered by the gate electrode; and
    doping the poly-silicon layer by a doping process using the gate electrode and the gate insulation layer with the stepped structure as a mask to form a lightly doped area and a heavily doped area.

2. The method for fabricating a lightly doped area according to claim 1, wherein the etching the gate insulation layer by the second dry etching process to form the stepped structure, wherein the width of the gate electrode is smaller than the width of the stepped structure, and the edge of the stepped structure is not covered by the gate electrode comprises:
    etching the gate insulation layer for a first time by a third dry etching process to form a preliminary stepped structure after the gate metal layer is etched by the first dry etching process to form the preliminary gate electrode.

3. The method for fabricating a lightly doped area according to claim 2, wherein after the gate electrode is formed, the method further comprises:

etching the gate insulation layer for a second time by a fourth dry etching process to form the stepped structure.

4. The method for fabricating a lightly doped area according to claim 3, wherein an etching rate of the dry etching is higher than an etching rate of the wet etching.

5. The method for fabricating a lightly doped area according to claim 1, further comprising comprises:

etching the gate insulation layer by the second dry etching process to form the stepped structure after the gate electrode is formed.

6. The method for fabricating a lightly doped area according to claim 1, the method further comprising:

removing the remaining photo-resist.

7. A thin film transistor, comprising the lightly doped area fabricated in the method for fabricating a lightly doped area according to claim 1, wherein the thin film transistor further comprises:

a substrate, and a poly-silicon layer, a gate insulation layer with a stepped structure, a gate electrode formed in sequence on the substrate, wherein a width of the gate electrode is smaller than a width of the stepped structure, and an edge of the stepped structure is not covered by the gate electrode; and a width of the lightly doped area is equal to a width of an area of the stepped structure not covered by the gate electrode.

8. A thin film transistor array substrate, comprising a plurality of the thin film transistors according to claim 7.

* * * * *